United States Patent
Hasegawa et al.

(10) Patent No.: US 6,971,074 B2
(45) Date of Patent: Nov. 29, 2005

(54) LAYOUT DEVICE

(75) Inventors: Takao Hasegawa, Tokyo (JP);
Tsunehiro Koyama, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 235 days.

(21) Appl. No.: 10/404,062

(22) Filed: Apr. 2, 2003

(65) Prior Publication Data

US 2004/0073878 A1   Apr. 15, 2004

(30) Foreign Application Priority Data

Oct. 15, 2002   (JP) .............................. 2002-300876

(51) Int. Cl.[7] ........................... G06F 17/50; G06F 9/45
(52) U.S. Cl. ................ 716/2; 716/4; 716/5; 716/11
(58) Field of Search ....................... 716/1, 2, 4, 5, 716/7–14

(56) References Cited

U.S. PATENT DOCUMENTS

| | | | | |
|---|---|---|---|---|
| 5,349,542 A | * | 9/1994 | Brasen et al. .................. | 703/15 |
| 5,404,310 A | * | 4/1995 | Mitsuhashi .................. | 716/13 |
| 5,471,409 A | * | 11/1995 | Tani ............................. | 703/14 |
| 5,598,348 A | * | 1/1997 | Rusu et al. ..................... | 716/2 |
| 5,872,724 A | | 2/1999 | Nakada | |
| 6,118,334 A | | 9/2000 | Tanaka et al. | |
| 6,311,147 B1 | * | 10/2001 | Tuan et al. .................... | 703/18 |
| 6,581,201 B2 | * | 6/2003 | Cano et al. .................... | 716/12 |
| 6,675,139 B1 | * | 1/2004 | Jetton et al. .................. | 703/17 |
| 6,725,434 B2 | * | 4/2004 | Murayama ...................... | 716/5 |
| 6,779,163 B2 | * | 8/2004 | Bednar et al. ................. | 716/7 |
| 6,794,674 B2 | * | 9/2004 | Kusumoto ........... | 257/E23.151 |
| 2003/0208737 A1 | * | 11/2003 | Brenner et al. ............... | 716/10 |
| 2003/0237059 A1 | * | 12/2003 | Schultz .......................... | 716/4 |
| 2004/0049754 A1 | * | 3/2004 | Liao et al. ..................... | 716/8 |
| 2004/0054979 A1 | * | 3/2004 | Bobba et al. .................. | 716/13 |

FOREIGN PATENT DOCUMENTS

| | | |
|---|---|---|
| JP | 9-55433 | 2/1997 |
| JP | 11-45979 | 2/1999 |
| JP | 2000-99554 | 4/2000 |

* cited by examiner

Primary Examiner—Leigh M. Garbowski
(74) Attorney, Agent, or Firm—Leydig, Voit & Mayer, Ltd.

(57) ABSTRACT

A layout device includes a processing type setting part for classifying a layout of a semiconductor integrated circuit in every area in accordance with the percentage voltage drop in the circuit, and for extracting a processing target portion composed of a group of areas, including an area having a percentage voltage drop exceeding a predetermined threshold; a layout generating part for applying layout change processing to alleviate differences of the percentage voltage drops among the areas for circuit components, such as power supply wiring and connecting points in the processing target portion.

3 Claims, 11 Drawing Sheets

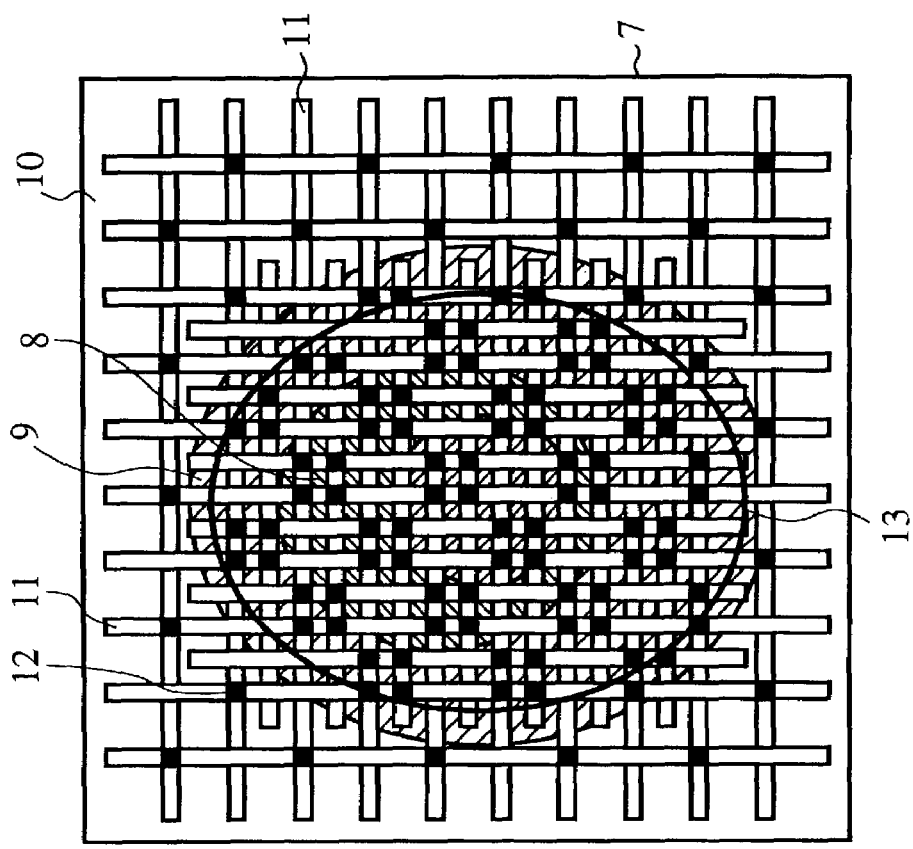

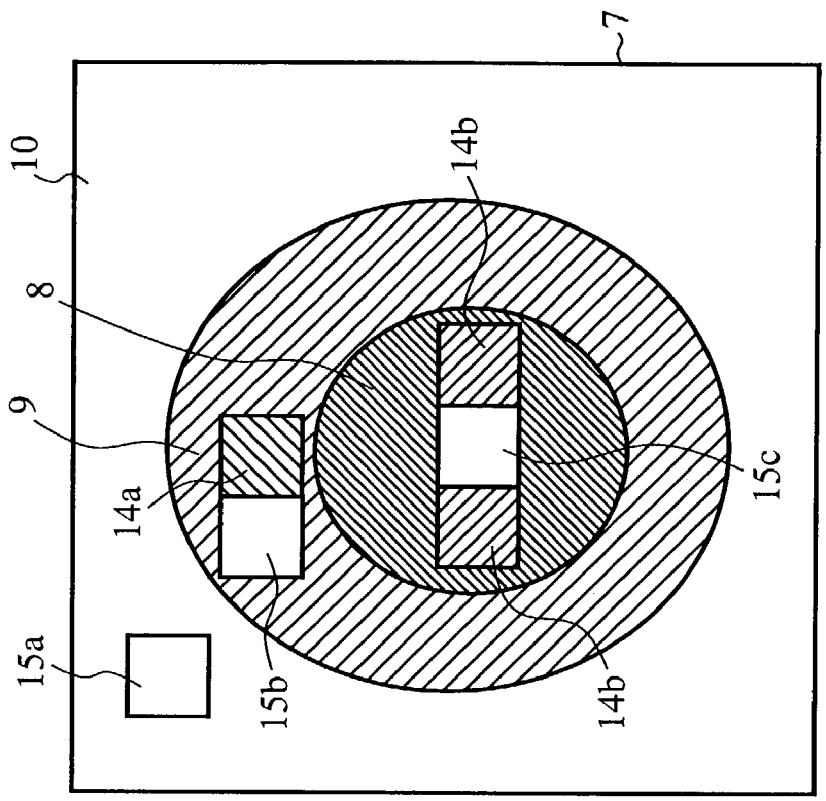
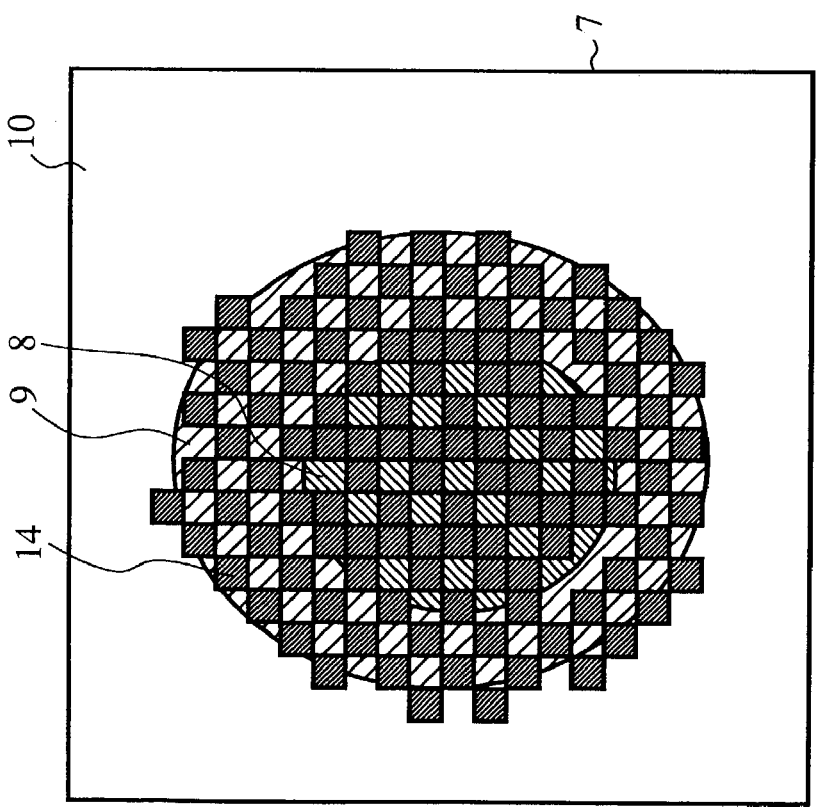

LAYOUT DEVICE

BACKGROUND OF THE INVENTION

1. Field of the Invention

The present invention relates to a layout device for designing a layout of a semiconductor integrated circuit by means of automatic placement and routing, more particularly to a layout device for performing a layout change processing dedicated to alleviating a difference of percentage voltage drop in the semiconductor integrated circuit, and to a program for executing the layout device by computer.

2. Description of the Related Art

With the recent developments in miniaturization of the semiconductor production technology, thinness of wiring and narrowness of the width of wiring has been encouraged, showing a tendency to increase in interconnect resistance and interconnect capacitance. Thus, important design matter in designing semiconductor integrated circuits is to reflect parasitic elements of the wiring.

In designing power supply wiring to supply power supply voltage to the semiconductor integrated circuit, it must be remembered that voltage will fluctuate in the power supply wiring due to the parasitic elements of the power supply wiring such as consumption currents flowing through circuits, resistance, capacitance, and inductance. In particular, as an operating frequency of the semiconductor integrated circuit increases, a delay time of signal propagation changes due to a voltage drop caused by the interconnect resistance, resulting in abnormal behavior that does not meet the design rule. In this event, normal behavior would not probably be guaranteed in actual behavior, even though the normal operation is ascertained when performing a logical simulation after a layout design has finished.

Conventionally, there has been performed processing to identify by a designer an area on the layout where the aforementioned deficiencies may occur, and for changing the area to a layout that meets the design rule on the basis of the results of a voltage drop analysis.

Specifically, the voltage drop analysis is made using resistance information on respective circuit components on the layout of the semiconductor integrated circuit, and the percentage voltage drop of respective circuit components such as power supply wiring and ground wiring is expressed by stages in different colors on an image of the layout data. See Patent Document 1 (Publication of Unexamined Japanese Patent Application No. 9-55433), for instance.

There used to be restrained by a designer the voltage drop by extracting an area whose difference of the percentage voltage drop on the layout is higher, and increasing the number and the width of wiring based on display information, what is called, by applying processing to reinforce the wiring.

As mentioned above, conventionally, there used to be identified by the designer an area on the layout where deficiencies would probably occur due to the voltage drop based on the results of the voltage drop, and performed a re-layout of wiring such as power supply wiring, ground wiring, or circuit cells so as to allow the entire circuit to operate within a range permissible by the design rule. In the other words, the designer is obliged to continually grasp whatever influence is exerted upon the entire circuit caused by modifications of the layout; as well as is sometimes precluded from making a layout change that provides a proper measure for the voltage drop unless it relies upon trial and error. For these reasons, the larger circuit size to be designed, the bigger labor required for a measure for the voltage drop imposed on the designer.

In its turn, it invites a delay of the development schedule to the amount of a period of time taken for some measures for the voltage drop.

SUMMARY OF THE INVENTION

The present invention has been made to solve the above-mentioned problems. An object of the present invention is to provide a layout device able to extract an area where deficiencies would probably be occurred caused by a difference of voltage drop on the basis of the results obtained by comparing the percentage voltage drop of respective circuit components on the layout of the semiconductor integrated circuit with the predetermined threshold, and to effectively and promptly take a measure for the voltage drop on the layout of the semiconductor integrated circuit concerned by applying layout change processing to alleviate the difference of the voltage drop to the circuit components in this area, and a program to be executed by computer.

A layout device according to the present invention includes a processing type setting part for classifying every area a layout of a semiconductor integrated circuit in accordance with the percentage voltage drop in the circuit, and for extracting a processing target portion composed of a group of areas including an area whose percentage voltage drop exceeds a predetermined threshold; a layout generating part for applying layout change processing to alleviate a difference of the percentage voltage drop among the areas to circuit components included in the processing target portion.

As mentioned above, according to the present invention, it classifies every area the layout of the semiconductor integrated circuit in accordance with the percentage voltage drop, extracts the processing target portion composed of the group of the areas including the area whose percentage voltage drop exceeds the predetermined threshold, and applies the layout change processing to alleviate the difference of the percentage voltage drop among the areas. This automatically alleviates the difference of the percentage voltage drop from the area whose percentage voltage drop is higher on the layout of the semiconductor integrated circuit concerned, and effectively and promptly takes a measure for the voltage drop.

A layout device according to the present invention includes a processing type setting part for classifying every area a layout of a semiconductor integrated circuit in accordance with the percentage voltage drop in the circuit, and for extracting a processing target portion composed of a group of areas where a difference of the percentage voltage drop is produced; a layout generating part for applying layout change processing to restrain the voltage drop when including an area whose percentage voltage drop exceeds a predetermined threshold to circuit components in the processing target portion, and for performing layout change processing to promote the voltage drop when including an area whose percentage voltage drop does not exceed the predetermined threshold.

As mentioned above, according to the present invention, it classifies every area the layout of the semiconductor integrated circuit in accordance with the percentage voltage drop in the circuit, extracts the processing target portion composed of the group of areas where a difference of the percentage voltage drop is produced, and applies layout change processing to restrain the voltage drop when including an area whose percentage voltage drop exceeds the predetermined threshold and applies layout change processing to promote the voltage drop when including an area whose percentage voltage drop does not exceed the predetermined threshold. This automatically alleviates the difference of the percentage voltage drop over the whole layout of the semiconductor integrated circuit concerned, and effectively and promptly takes a measure for the voltage drop.

The above and other objects and the attendant advantages of the invention will become readily apparent by referring to the following detailed description when considered in conjunction with the accompanying drawings, wherein:

BRIEF DESCRIPTION OF THE DRAWINGS

FIG. 6 is a drawing explaining layout change processing to restrain the voltage drop by the layout device of a first embodiment;

FIG. 8 is a drawing explaining layout change processing to restrain the voltage drop by the layout device of a second embodiment;

Throughout the figures, the same reference numerals, and characters, unless otherwise noted, are used to denote like features, elements, components, or parts of the illustrated embodiment.

DETAILED DESCRIPTION OF THE PREFERRED EMBODIMENTS

Preferred embodiments of the present invention will now be described hereinafter in detail with reference with the attached drawings.

First Embodiment

Figure 1:
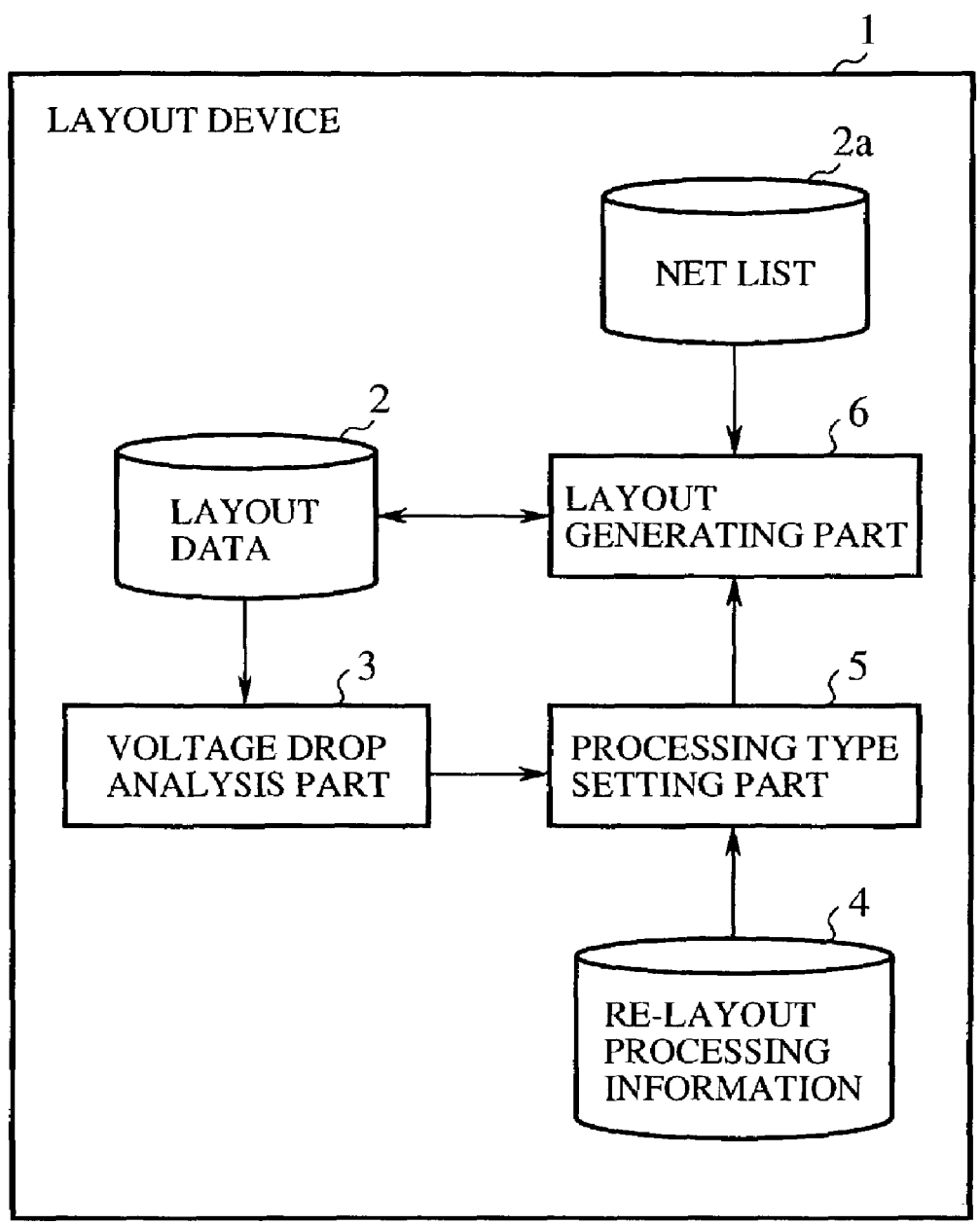
FIG. 1 is a drawing showing a configuration of the layout device of a first embodiment.

FIG. 1 is a drawing showing a configuration of a layout device of the first embodiment.

In FIG. 1, a layout device 1 of the first embodiment creates a circuit layout of a semiconductor integrated circuit and performs re-layout processing based on the results of a voltage drop analysis. The layout device 1 is configured by computer that executes programs implementing functions in respective component described later.

The description is then made to components in the layout device 1. Layout data 2 is generated by a layout generating part 6 by automatically placing and routing circuit components such as cells and interconnections on the basis of circuit connection information and timing conditions of a net list 2a. This layout data 2 is intended for the voltage drop analysis. A voltage drop analysis part 3 is a constituent for executing the voltage drop analysis of the layout data 2 and calculates the voltage drop of respective circuit components on a layout of the semiconductor integrated circuit concerned. The voltage drop analysis part 3 can be implemented by a program executed by computer that constitutes the layout device 1.

Re-layout processing information (memory) 4 is information that defines what sort of re-layout is executed as a measure for the voltage drop, which contains information that defines a layout to reinforce power supply wiring as processing to restrain the voltage drop, and information that defines a layout to cull out the power supply wiring as processing to promote the voltage drop. The re-layout processing information 4 is stored in memory mediums such as a hard disk device which is a standard equipment of computer that constitutes the layout device 1, or a computer readable CD-ROM.

A processing type setting part 5 selects information on processing to restrain or to promote the voltage drop from the re-layout processing information 4 and provides the information to a layout generating part 6. The layout generating part 6 generates the layout data 2 and performs as a measure for the voltage drop a re-layout depending on the information provided from the processing type setting part 5. The processing type setting part 5 and the layout generating part 6 can be implemented by programs executed by computer that constitutes the layout device 1.

Figure 2:
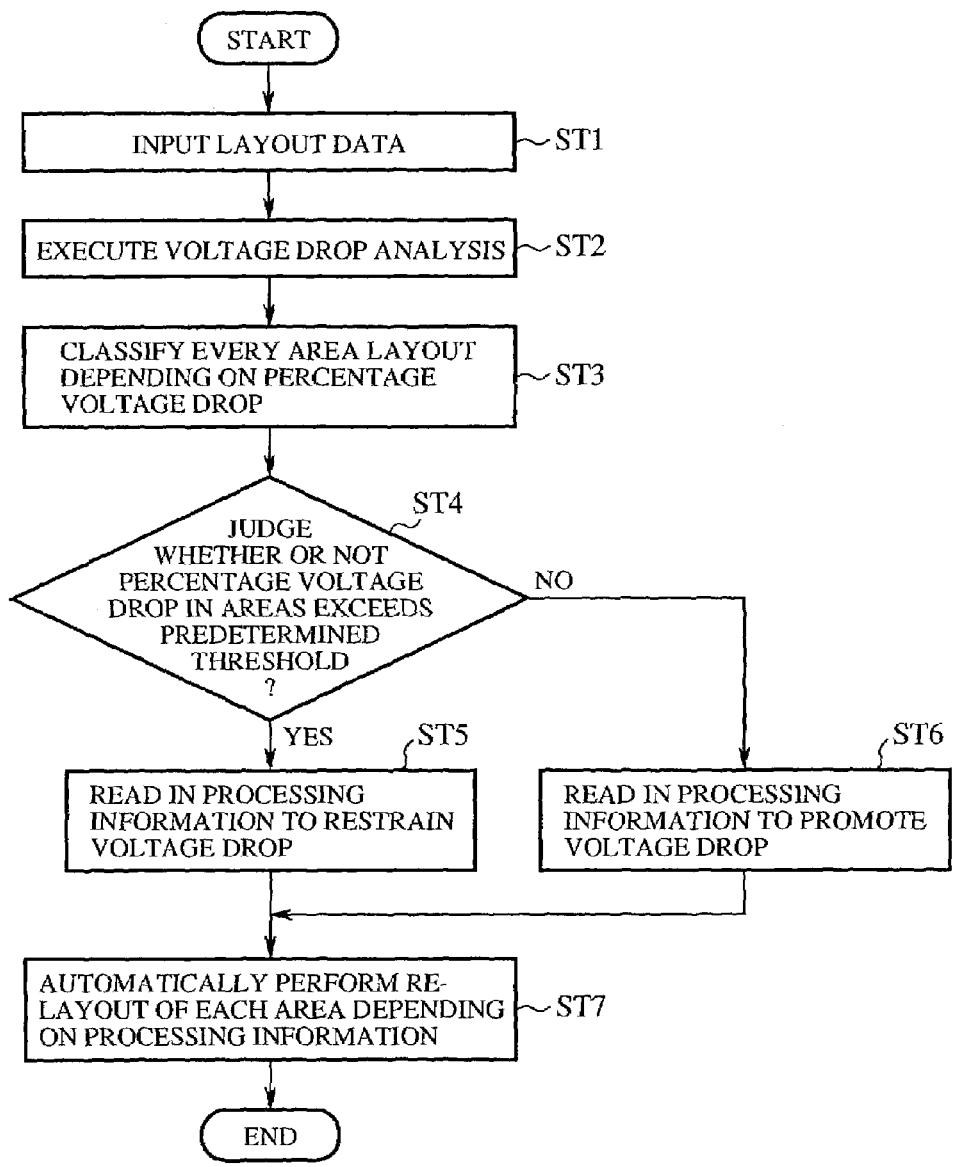
FIG. 2 is a flow chart showing operations of the layout device shown in FIG. 1.

FIG. 2 is a flow chart showing operations of the layout device shown in FIG. 1.

The re-layout processing of the layout device of the first embodiment will now be described in detail below with reference to FIG. 2.

Initially, the layout data 2 created by the layout generating part 6 is transferred to the voltage drop analysis part 3 (step ST 1). The voltage drop analysis part 3 finds a current flowing through respective circuit components such as power supply wiring and ground wiring on the layout using such an existing technique as the dynamic analysis technique. After that, the voltage drop analysis part 3 calculates voltage based on the current flowing through respective elements and the wiring resistance and computes the percentage voltage drop, taking the prescribed value as 100% (step ST 2).

Subsequently, the voltage drop analysis part 3 classifies every area the layout in accordance with the percentage voltage drop of the respective circuit components (step ST 3). The voltage information classified every area is then transferred from the voltage drop analysis part 3 to the processing type setting part 5. The processing type setting part 5 judges whether or not the percentage voltage drop in respective areas 8,9,10 on the layout exceeds a predetermined threshold on the basis of the voltage information provided from the voltage drop analysis part 3, and selects either of processing, i.e., processing to restrain the voltage drop, or processing to promote the voltage drop (step ST 4).

The above predetermined threshold is a reference value versus the percentage voltage drop to extract an area where deficiencies would probably be occurred caused by a difference of the percentage voltage drop from the semiconductor integrated circuit on a designed layout. For example, the voltage drop analysis and a layout change may be repeatedly executed in order to determine the percentage voltage drop as the threshold in the case where the semiconductor integrated circuit behaves up to the design rule.

At step ST 4, the processing type setting part 5 reads in processing information to restrain the voltage drop on an area whose percentage voltage drop exceeds the predetermined threshold from the re-layout processing information 4 (step ST 5). On the other hand, the processing type setting part 5 reads in processing information to promote the voltage drop on an area whose percentage voltage drop does not exceed the predetermined threshold from the re-layout information 4 (step ST 6).

Subsequently, the processing type setting part 5 provides information to specify each area on the layout and processing information on a portion composed of these areas to the layout generating part 6. The layout generating part 6 performs re-layout processing of the layout data 4 depending on the processing information provided from the processing type setting part 5 (step ST 7).

A series of processing to the re-layout processing will next be described in detail below.

Figure 3:
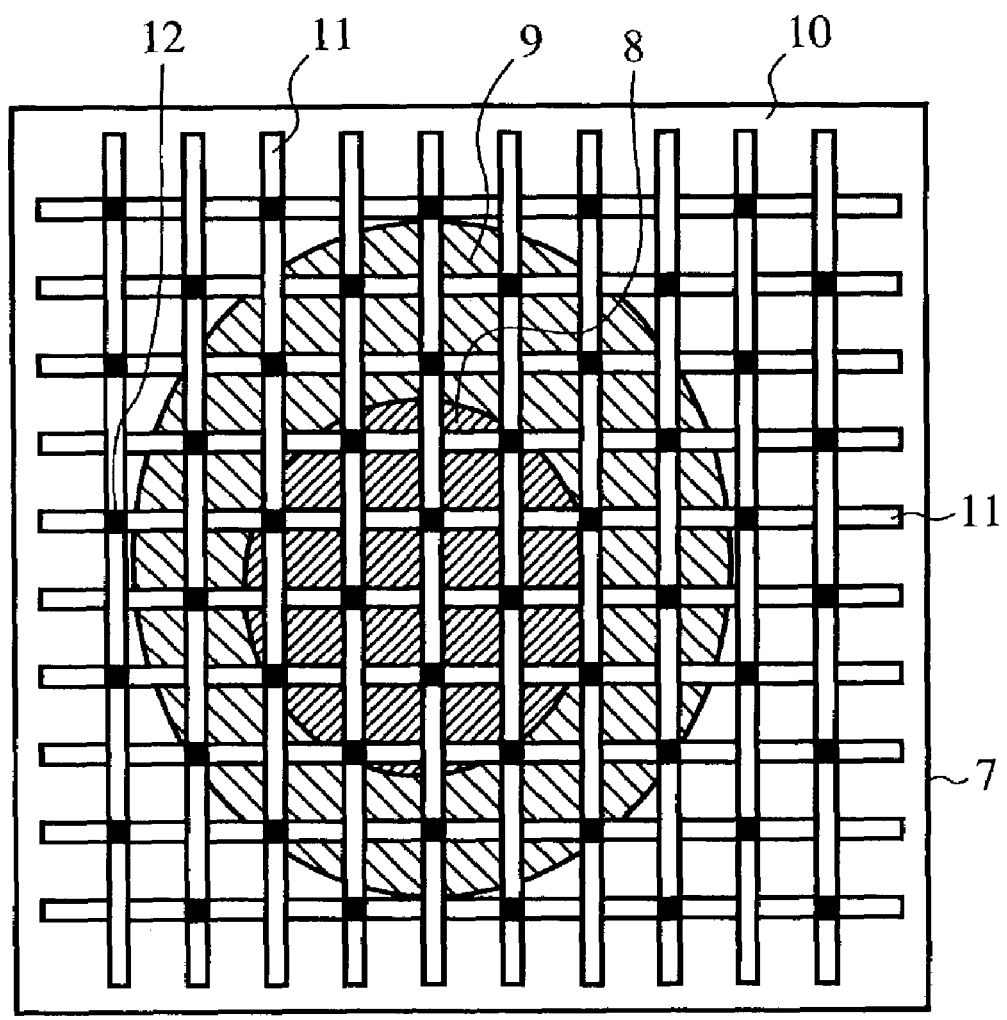
FIG. 3 is a drawing showing the results of a voltage drop analysis of a first embodiment.

FIG. 3 is a drawing showing the results of the voltage drop analysis of the layout data.

Figure 4A:
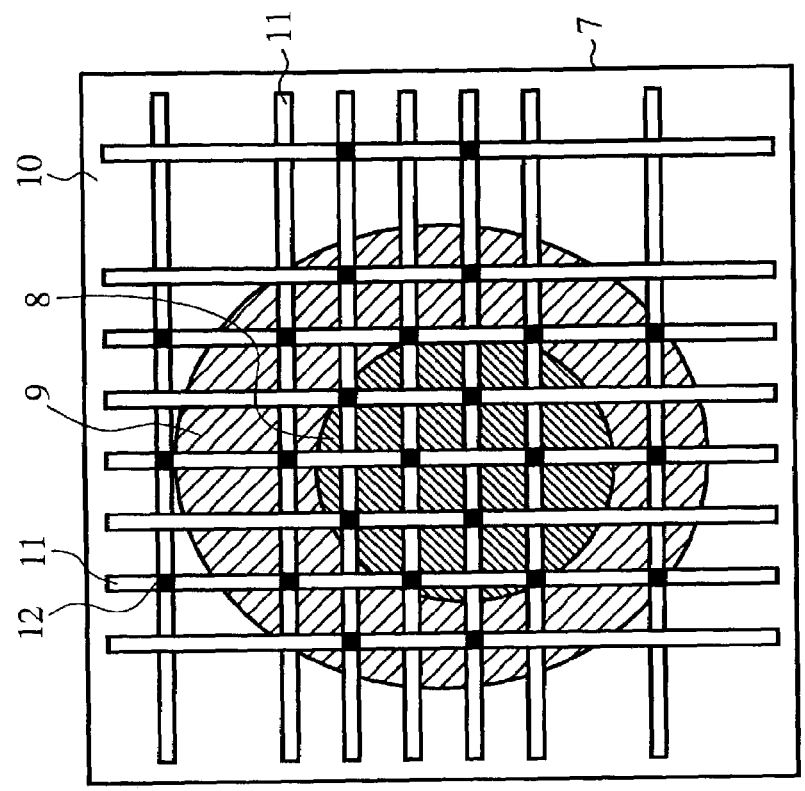
FIG. 4 is a drawing explaining layout change processing to promote the voltage drop by the layout device of a first embodiment.
Figure 4B:
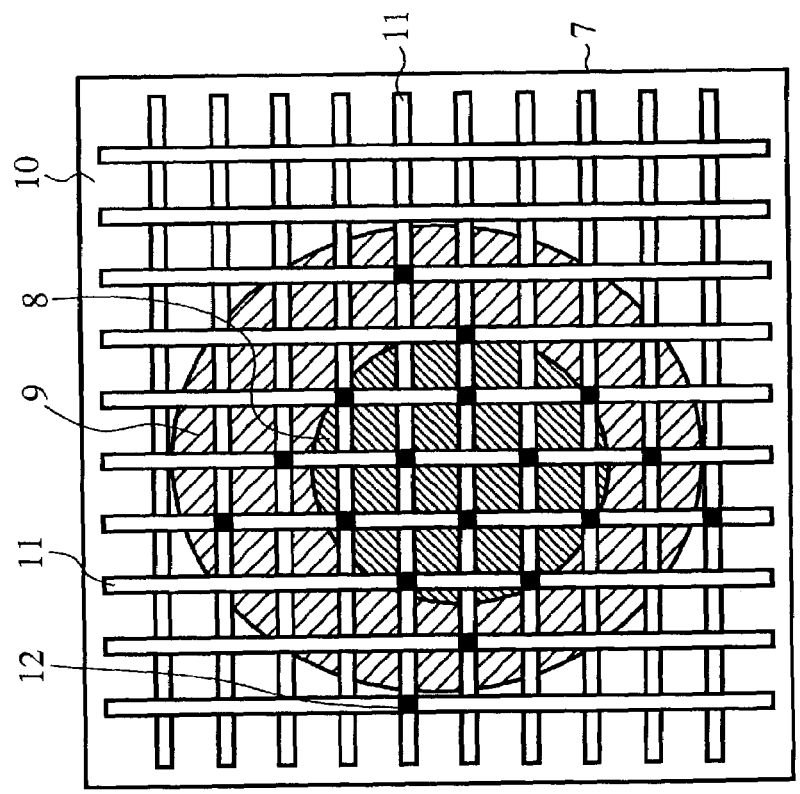

FIG. 4 is a drawing explaining layout change processing to promote the voltage drop by the layout device of the first embodiment. FIG. 4A is a drawing showing the results obtained by applying the layout change processing to cull out connecting points (circuit component) to the results of the voltage drop analysis shown in FIG. 3. FIG. 4B is a drawing showing the results obtained by applying the layout change processing to cull out main power supply wiring (circuit component) to the results of the voltage drop analysis.

Figure 5B:
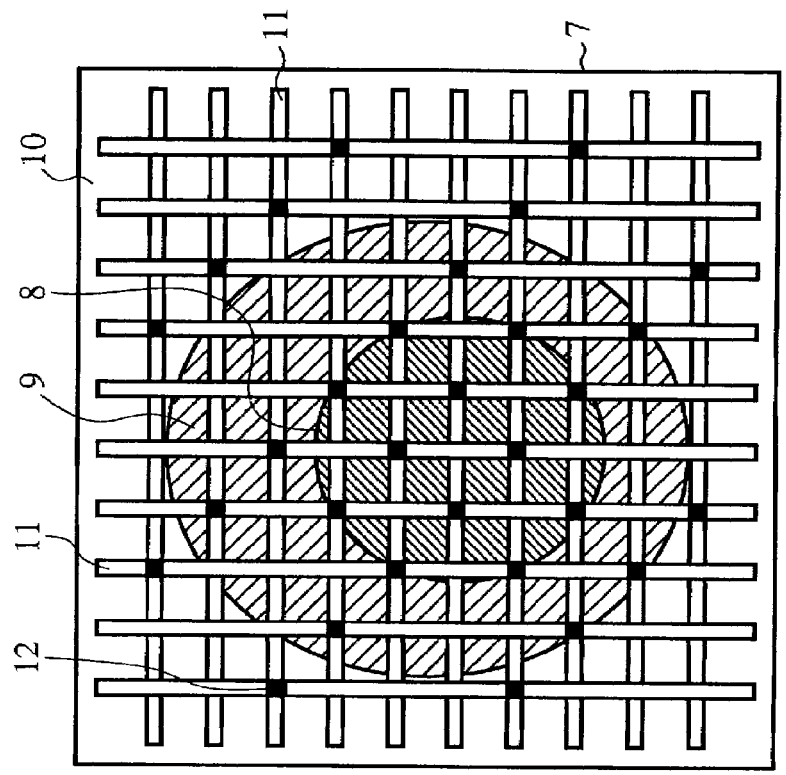
FIG. 5 is a drawing explaining layout change processing to restrain the voltage drop by the layout device of a first embodiment.
Figure 5A:
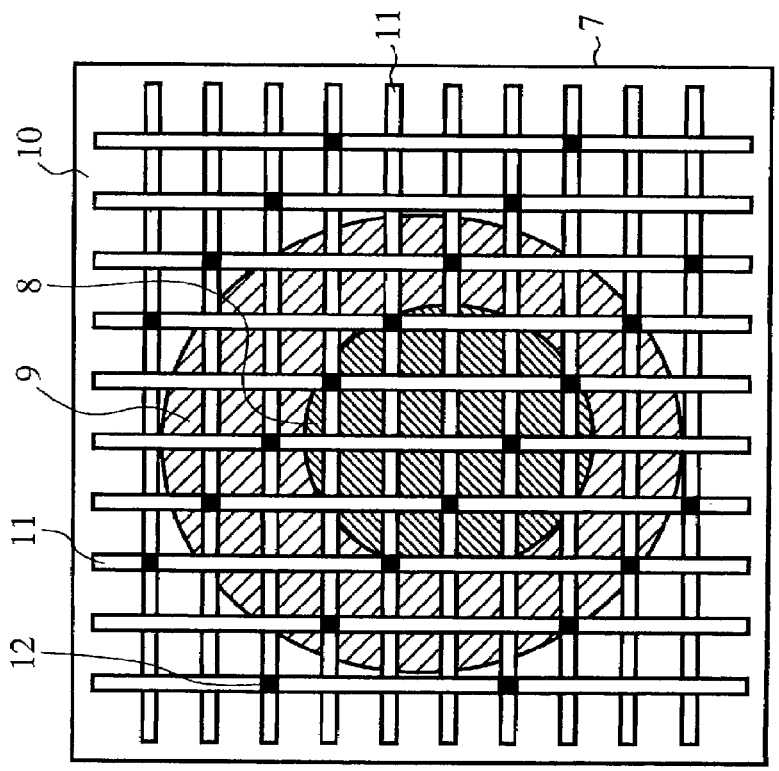

FIG. 5 is a drawing explaining the layout change processing to restrain the voltage drop by the layout device of the first embodiment shown in FIG. 3. FIG. 5A is a drawing showing the results of the voltage drop analysis of the layout data. FIG. 5B is a drawing showing the results obtained by applying layout change processing to add connecting points to the results of the voltage drop analysis.

FIG. 6 is a drawing explaining the layout change processing to restrain the voltage drop by the layout device of the first embodiment. FIG. 6A is a drawing showing an example of the results obtained by applying the layout change processing to add the main power supply wiring and the connecting points to the results of the voltage drop analysis shown in FIG. 5A. FIG. 6B is a drawing showing another example obtained by applying the results of the layout change processing to add the main power supply wiring and the connecting points to the results of the voltage drop analysis shown in FIG. 5A.

Figure 7:
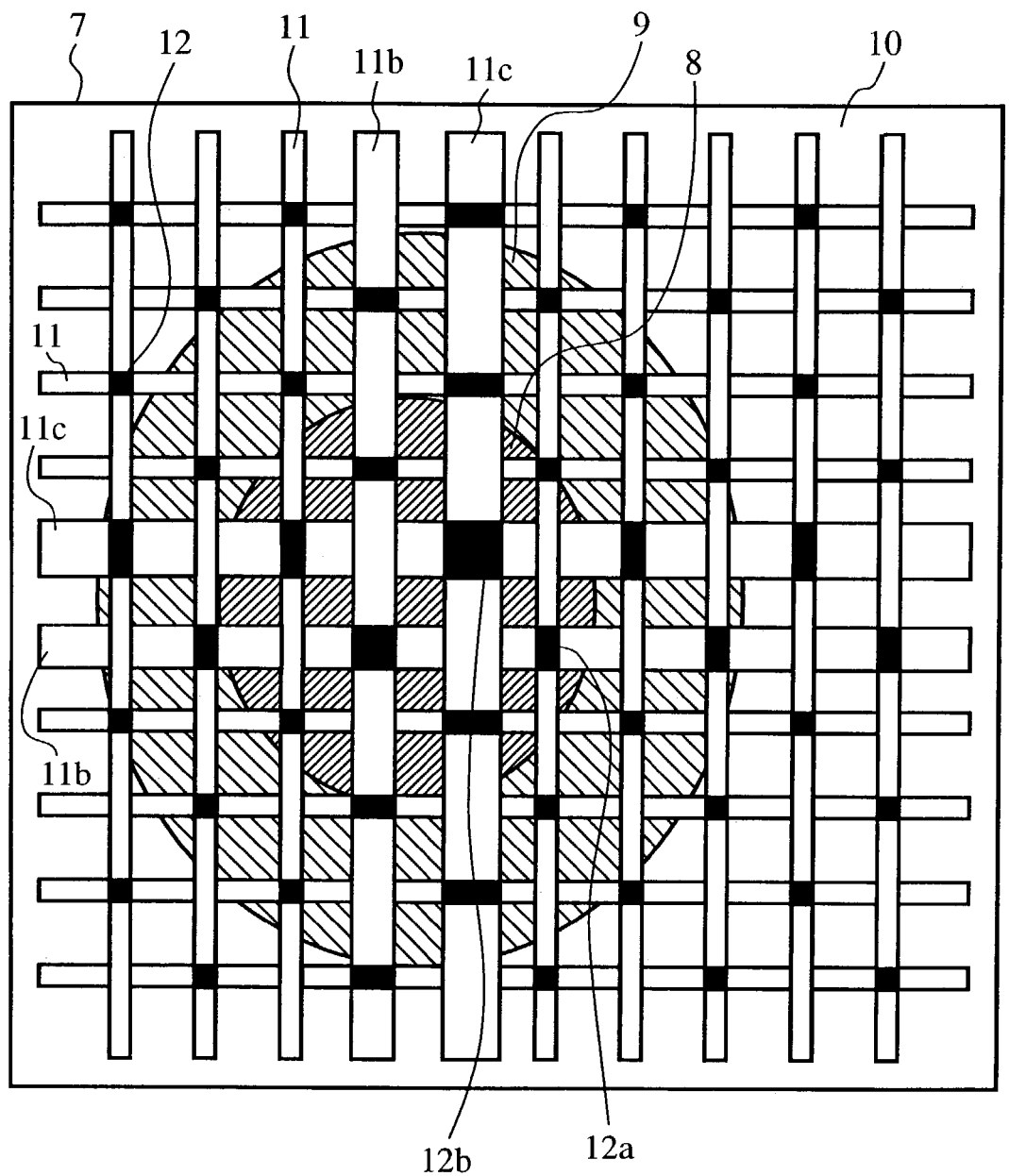
FIG. 7 is a drawing explaining layout change processing to restrain the voltage drop by the layout device of a first embodiment.

FIG. 7 is a drawing explaining the layout change processing to restrain the voltage drop by the layout device of the first embodiment shown in FIG. 7. In FIG. 7, main power supply wiring (circuit component) 11b, 11c have the larger width of wiring than main power supply wiring (circuit component) 11, which restrains the voltage drop.

The results of the voltage drop analysis 7 shown in FIG. 7 shows areas 8,9,10 assorted by color in accordance with the percentage voltage drop in each area on the layout concerned, on which connecting points (circuit component) 12 such as through holes and contact holes that electrically connects interconnections including the main power supply wiring 11 and connecting circuit cells (not shown).

Hereupon, assuming that the threshold to define a range concerning the least upper bound of the percentage voltage drop responsible for definition of processing of the above re-layout to be 10%, and the threshold to define a range concerning the least lower bound to be 10 to 15%. In case each portion in a certain area shows a voltage drop varying within the range of 10 to 15%, this area is classified as an area 8 whose percentage voltage drop is the highest. In case each portion in a certain area shows a voltage drop varying within the range of 5 to 10%, this area is classified as an area 9 whose percentage voltage drop is medium. In case each portion in a certain area shows a voltage drop varying within the range of 0 to 5%, this area is classified as an area 10 where the voltage drop scarcely occurred.

The results of the voltage drop analysis 7 shown in FIG. 7 shows an extracted portion composed of the areas 8, 9, 10 as stated above. Moreover, the layout device 1 of the first embodiment creates data that displays the results of the voltage drop analysis 7 as shown in FIG. 3 in executing a voltage drop analysis of the layout data 2, and provides the created data to a designer through a display device (not shown).

At step ST 4, when the processing type setting part 5 receives information to specify the percentage voltage drop contained in the results of the voltage drop analysis 7 from the voltage drop analysis part 3, the part 5 judges whether or not the percentage voltage drop in each area on the layout classified as above exceeds a predetermined the predetermined threshold. At this time, if the percentage voltage drop does not exceed the predetermined threshold, the processing type setting part 5 reads in information to promote the voltage drop from the re-layout processing information 4 and provides the information to the layout generating part 6 (step ST 6).

Thereafter, the layout generating part 6 performs re-layout processing (voltage drop promoting processing, voltage drop restraining processing) of the layout data 4 as shown below based on the processing information provided from the processing type setting part 5 (step ST 7).

First, the operation of the re-layout processing to promote the voltage drop of the first embodiment will be described below.

As re-layout processing to promote the voltage drop, processing to cull out connecting points 12 is given as shown in FIG. 4A, for instance. Specifically, the layout generating part 6 culls out at a given frequency the connecting points 12 from re-layout area. Here, if two connecting points 12 are placed, one of which is culled out, for instance.

Alternatively, taking advantage of resistance values of each of the connecting points 12 already known from the circuit connection information of the net list 2a, the layout generating part 6 maybe performed re-layout processing while flexibly changing a cull out frequency of the connecting points 12 such that the portion has the percentage voltage drop that meets the design rule.

Other than the above, processing to cull out the number of the main power supply wiring 11 is given as shown in FIG. 4B. Specifically, the layout generating part 6 extracts from a re-layout portion circuits which have the similar circuit configuration one another and in which a plurality pair of main power supply wiring 11 are interconnected among the circuits, and culls out from these circuits the plurality pair of main power supply wiring 11. If two pair of main power supply wiring 11 are placed, one of which is culled out, for instance. Alternatively, availing itself of already known resistance values per unit length of individual main power supply wiring 11, the layout generating part 6 may perform re-layout processing while flexibly changing a cull out frequency of the main power supply wiring 11 such that the portion has the percentage voltage drop that meets the design rule.

Meanwhile, at step ST 4, when the percentage voltage drop of the respective areas 8,9,10 exceeds the predetermined threshold, the processing type setting part 5 reads in processing information to restrain the voltage drop from the re-layout processing part 4, and provides the information to the layout type setting part 6 (step ST 5).

Next, the operation of the re-layout processing to restrain the voltage drop of the first embodiment will be described below.

As re-layout processing to restrain the voltage drop, processing to add the number of the connecting points 12 is given as shown in FIG. 5B, for instance. Specifically, the layout generating part 6 adds at a given frequency the connecting points 12 to the re-layout portion as shown in FIG. 5A. If two connecting points 12 are placed, one connecting point 12 is further added to these points, for instance. Alternatively, making use of resistance values of the individual connecting points 12 already known from circuit connecting information of the net list 2a, the layout generating part 6 may perform re-layout processing while flexibly changing an additional frequency of the connecting points 12 such that the portion has the percentage voltage drop that meets the design rule.

Other than the above, processing to add the number of the main power supply wiring 11 and that of the connecting points 12 is given as shown in FIG. 6. Specifically, as shown in FIG. 6A, the layout generating part 6 extracts from the re-layout portion circuits which have similar circuit configuration one another and in which a plurality pair of main power supply wiring 11 are interconnected among the circuits, and adds a plurality pair of main power supply wiring 11 to these circuits. Further, in keeping with the addition of the main power supply wiring 11, the connecting points 12 are also added.

If two main power supply wiring 11 are placed, one main power supply wiring 11 is added, for instance. Alternatively, taking advantage of resistance values per unit length of the individual main power supply wiring 11 and those of the connecting points 12 already known from circuit connection information of the net list 2a, the layout generating part 6 may perform re-layout processing while flexibly changing an additional frequency of the main power supply wiring 11 or the connecting points 12 such that the portion has the percentage voltage drop that meets the design rule.

Moreover, processing to add the main power supply wiring 11 and the connecting points 12 may be performed, with the processing centralizing in a portion 13 composed of areas whose percentage voltage drop exceeds the predetermined threshold as shown in FIG. 6B. Specifically, the layout generating part 6 extracts the number of the main power supply wiring 11 and that of the connecting points 12 per unit area in the portion 13 from the circuit connection information of the net list 2a , and adds the main power supply wiring 11 and the connecting points 12 so that a given ratio is fulfilled, taking a ratio of these numbers as a reference.

For example, the ratio between the number of the wiring 11 and that of connecting points 12 is previously set in such a manner as to maintain the relationship of the area 8:area 9:area 10= 2:1:0.5 in accordance with the percentage voltage drop of each area so that the main power supply wiring 11 and the connecting points 12 are added on centralization on the area 13. The layout generating part 6 adds the main power supply wring 11 and the connecting points 12 so that the above ratio is fulfilled, supposing that the ratio between the number of the wiring 11 and that of the connecting points 12 to be 1 (reference), thereby centrally placing the main power supply wiring 11 and the connecting points 12 on the portion 13 composed of areas whose percentage voltage drop exceeds the predetermined threshold.

In passing, availing itself of resistance values of the main power supply wiring 11 per unit length and those of the connecting points 12 already known from the circuit connection information of the net list 2a, the layout generating part 6 may perform re-layout processing while flexibly changing the ratio between the number of the wiring 11 and that of the connecting points 12 such that the portion has the percentage voltage drop that meets the design rule. Alternatively, as layout change processing to promote the voltage drop, the ratio between the number of the wiring 11 and that of connecting points 12 may be decreased in performing re-layout processing, for instance.

Also, as shown in FIG. 7, the voltage drop may be restrained by increasing the width of wiring of the wiring 11 and an area of the connecting points 12 in accordance therewith without altering the number of the wiring 11 and that of the connecting points 12. Specifically, the layout generating part 6 extracts from the re-layout portion circuits which have similar circuit configuration one another and in which a plurality pair of main power supply wiring 11 are interconnected among the circuits, and increases the width of wiring of the plurality pair of main power supply wiring 11. For example, the width of wiring of the main power supply wiring 11 is doubled as compared with the original layout. In FIG. 7, wiring 11b,11c and connecting points 12a, 12b are shown as wiring and connection points whose width of wiring and area are enlarged by the re-layout processing.

Alternatively, making use of resistance values of the individual main power supply wiring 11 and those of the connecting points 12 already known from the circuit connection information of the net list 2a, the layout generating part 6 may perform re-layout processing while flexibly changing expansion and reduction ratio of the width of the wiring 11 and an area of the connecting points 12. For example, as layout change processing to promote the voltage drop, processing to reduce the width of the wiring and an area of the connecting points 12 may be performed.

As mentioned in the above, the voltage drop analysis part 3 executes a voltage drop analysis of the layout data 2 again after the re-layout processing has performed by the layout generating part 5. Here, when it is judged that there still remains on the layout an area whose difference of the percentage voltage drop is higher, and there is the possibility of behaving not up to the design rule, the processing shown in FIG. 2 is repeatedly performed. In this event, the predetermined threshold devoted to a reference of the percentage voltage drop may be adequately changed to alleviate a difference of the percentage voltage drop on the layout.

As mentioned above, according to the first embodiment, it compares the percentage voltage drop in respective circuit components on the layout with the predetermined threshold, extracts the area on the layout where deficiencies would probably be occurred caused by the voltage drop, and applies layout change processing to restrain or to promote the voltage drop to the circuit components in the area. This alleviates a difference of the percentage voltage drop over the whole layout, and applies an effective and prompt measure for the voltage drop to the layout of the semiconductor integrated circuit concerned.

Whereas, in the first embodiment, an example is given that the processing type setting part 5 selects an area on the layout where processing to restrain the voltage drop is to be applied, and an area on the layout where processing to promote the voltage drop is to be applied, either of processing may be selected. For example, assuming, in the results of the voltage drop analysis as shown in FIG. 3, the percentage voltage drop in the area 8 to be R%, in the area 9 to be S%, and in the area 10 to be T%(R>S>T). By comparing the percentage voltage drop of the area 8 that composes the portion and whose voltage drop is the highest, collective voltage drop restrain processing may be performed for a portion including an area whose percentage voltage drop R% exceeds the predetermined threshold. Conversely, collective voltage drop promote processing may be performed only for a portion including an area whose percentage voltage drop R% does not exceed the predetermined threshold without performing processing to restrain the voltage drop.

Second Embodiment

In the first embodiment, an example is given that the re-layout processing to alleviate a difference of the percentage voltage drop is performed by adding or deleting the main power supply wiring and the connecting points. In contrast, the second embodiment is directed to performing re-layout processing to adjust the density of the circuit cells on the layout using dummy cells that forbid performing a re-layout so as to alleviate a difference of the percentage voltage drop. Besides, the layout device of the second embodiment has the basic configuration common to the first embodiment, but differ in contents of the re-layout processing information 4, and in operations of the processing type setting part 5 and the layout generating part 6 as mentioned later.

FIG. 8 is a drawing explaining layout change processing to restrain the voltage drop by the layout device of the second embodiment. FIG. 8A is a drawing showing processing to place at a given occupancy rate the dummy cells whose area are uniform. FIG. 8B is a drawing showing processing to vary at a given rate an area of the dummy cells. In FIGS. 3A, 3B, the dummy cells 14, 14*a*, 14*b* indicate a placement forbidden area where placement of the circuit cells (circuit component) are forbidden at the time of layout processing. The same reference numerals as FIG. 3 indicate the same components, and therefore descriptions thereof are omitted for brevity's sake.

The description will now be made as to FIG. 8A.

The processing type setting part 5 in the layout device 1 of the second embodiment, upon extraction of a portion including an area whose percentage voltage drop exceeds the predetermined threshold on the layout in the processing to step ST 4 described in the first embodiment, reads out the dummy occupancy rate per an unit area set depending on the percentage voltage drop of each area, which is held in advance as re-layout processing information 4 in place of step ST 5 and step 6 shown in FIG. 2, and provides the rate to the layout generating part 6. Where the areas 8,9,10 are classified into an area where the percentage voltage drop exceeds 10%, an area exceeds 5% and less than 10%, and an area less than 5%, for instance, the relationship of the area 8:area9:area10= 10%,5%,0% is previously set as the dummy cell occupancy rate per an unit area depending on each percentage voltage drop.

Subsequently, the layout generating part 6 performs re-layout processing based on the dummy cell occupancy rate set by the processing type setting part 5. Specifically, first, dummy cells 14 are temporally placed uniformly on each area so as to satisfy the dummy sell occupancy rate. Then, in order to avoid a re-layout of the circuit cells to a placement position of the dummy cells, re-layout processing of the circuit cells is performed. After the re-layout processing of the circuit cells has finished, re-layout processing of the wiring and connecting points is performed except the dummy cells 14. The above processing corresponds to step ST 7 shown in FIG. 2.

In this way, uniformly placing the dummy cells 14 and dispersing the circuit cells allows restraint of the voltage drop of the area whose percentage voltage drop is higher, as a result of centralized placement of the circuit cells to be supplied thereto the power supply voltage on the original layout. Conversely, as for the area on which the circuit cells are dispersedly placed on the original layout and has a lower percentage voltage drop, the voltage drop is promoted by reasons of an increase in the number of placement of the circuit cells, leading to promotion of the voltage drop, which alleviates the difference of the percentage voltage drop from areas whose percentage voltage drop is higher. This effectively and promptly takes a measure for the voltage drop of the layout of the semiconductor integrated circuit concerned.

The description will next be made as to FIG. 8B.

The processing type setting part 5, upon extraction a portion including an area whose percentage voltage drop exceeds the predetermined threshold from the layout in the processing to step ST 4 in FIG. 2, reads out an area increase rate set depending on the percentage voltage drop of each area, which is held in advance as re-layout information 4 in place of step ST 5 and step ST 6, and provides the rate to the layout generating part 6. Where the areas 8,9,10 are classified into an area where the percentage voltage drop exceeds 10%, an area exceeds 5% and less than 10%, and an area less than 5%, for instance, the relationship of the area 8:area9: area10=5%, 10%,0% is previously set as the dummy cell occupancy rate per an unit area depending on each percentage voltage drop.

Subsequently, the layout generating part 6 converts the originally placed circuit cells into circuit cells to which the dummy cells are adjacent depending on the percentage voltage drop of each area. In FIG. 8B, at the area 8 whose percentage voltage drop is the highest, the circuit cells are converted into a circuit cell 15*c* to which two dummy cells 14*b* are adjacent, at the area 9 whose percentage voltage drop is medium, the circuit cells are converted into a circuit cell 15*b* to which a dummy cell 14*a* are adjacent, and at the area 10 whose percentage voltage drop is the lowest, the circuit cells are converted into a circuit cell 15*a* free from any dummy cells.

After that, the layout generating part 6 changes the area so that the area increase rate set to the respective dummy cells 14*a*, 14*b* by the processing type setting part 5 is fulfilled. Then, in order to avoid a re-layout of another circuit cells to the placement position of the dummy cells, a re-layout processing of the circuit cells are performed. After re-layout of the circuit cells has finished, re-layout processing of the wiring and connecting points are performed except the dummy cells 14*a*, 14*b*. The above processing corresponds to step ST 7 shown in FIG. 2.

In this way, enlarging an area of the dummy cells 14*a*,14*b* and dispersing the circuit cells permits restraint of the voltage drop of the area whose percentage voltage drop is higher, as a result of centralized placement of the circuit cells to be supplied thereto the power supply voltage on the original layout. Conversely, as for the area where the circuit cells are dispersedly placed on the original layout and has a lower percentage voltage drop, the voltage drop is promoted by reasons of an increase in the number of placement of the circuit cells, which alleviates the difference of the percentage voltage drop from areas whose percentage voltage drop is higher. This effectively and promptly takes a measure for the voltage drop of the layout of the semiconductor integrated circuit concerned.

Third Embodiment

In the second embodiment, an example is given that the re-layout processing to alleviate a difference of the percentage voltage drop is performed using the dummy cells. In contrast, the third embodiment is directed to changing an area of placement area and placement position of the circuit cells to alleviate the difference of the percentage voltage drop. Besides, the layout device of the second embodiment has the basic configuration common to the first embodiment, but differ in contents of re-layout processing information 4, and in operations of the processing type setting part 5 and the layout generating part 6 as mentioned later.

Figure 9B:
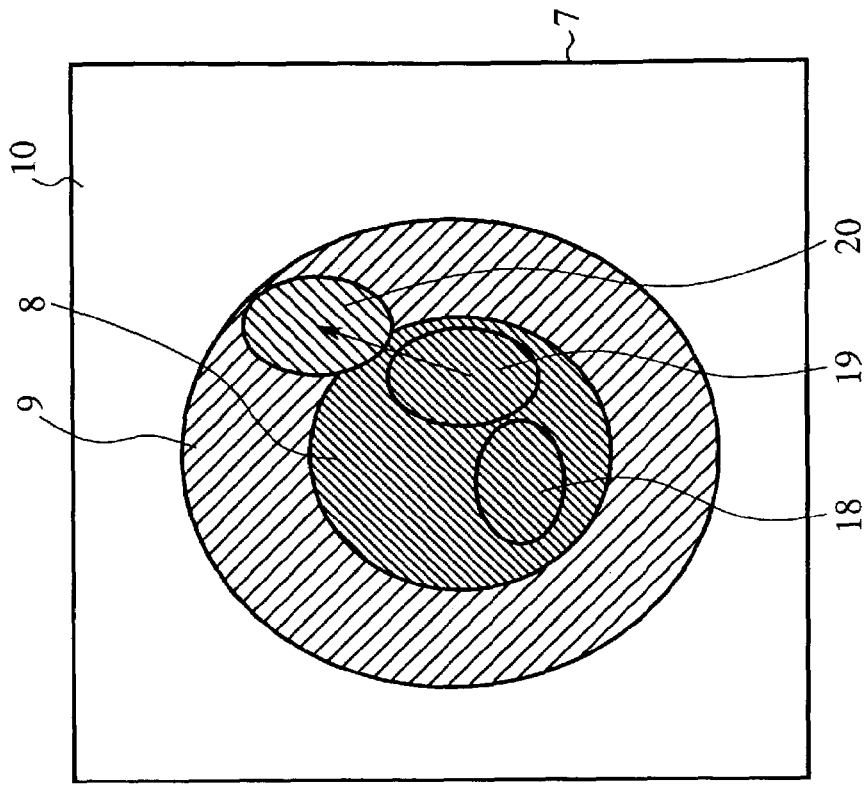
FIG. 9 is a drawing explaining layout change processing to restrain the voltage drop by the layout device of a third embodiment.
Figure 9A:
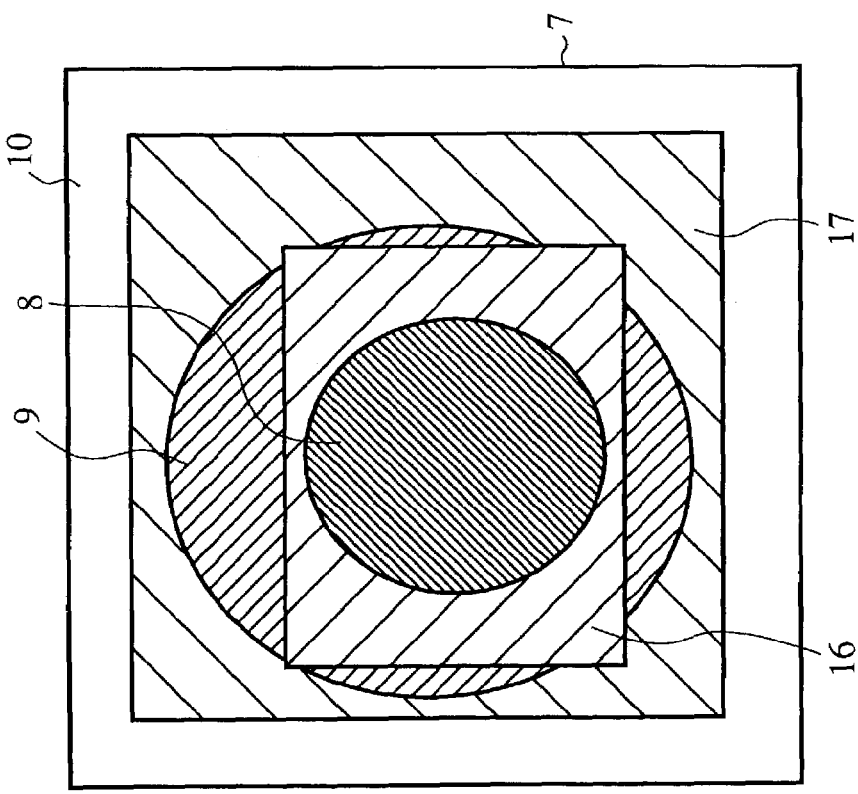

FIG. 9 is a drawing explaining layout change processing to restrain the voltage drop by the layout device of the third embodiment. FIG. 9A is a drawing showing processing to change at a given rate an area of placement area of the circuit cells (circuit component). FIG. 9B is a drawing showing processing in which a logical module (circuit component) composed of a group of densely placed circuit cells are not adjacent to one another. The same reference numerals as FIG. 3 indicate the same components, and therefore descriptions thereof are omitted for brevity's sake.

The description will next be made as to FIG. 9A.

When the processing type setting part 5 in the layout device 1 of the third embodiment extracts an area whose percentage voltage drop exceeds the predetermined threshold to step ST 4 shown in FIG. 2 described in the first embodiment, the part 5 reads out an area increase rate set depending on the percentage voltage drop of each area, which is held in advance as the re-layout information 4 in place of step 5 ST 5 and step ST 6 shown in FIG. 2, and provides the rate to the layout generating part 6. Where the areas 8,9,10 are classified into an area where the percentage voltage drop exceeds 10%, an area exceeds 5% and less than 10%, and an area less than 5%, for instance, the relationship of the area 8:area 9= 150%,120% is previously set as the area increase rate from an area of the original area depending on each percentage voltage drop.

Subsequently, the layout type setting part 6 enlarges the area so that the area increase rate is fulfilled depending on the percentage voltage drop of each area. In FIG. 9A, the area 8 whose percentage voltage drop is higher is enlarged in order to take it as an area 16 and places at enlarged intervals respective circuit cells placed on the original area 8 on the area 16 in accordance with the area increase rate. Further, the area 9 whose percentage voltage drop is medium is enlarged in order to take it as an area 17 and places at enlarged intervals respective circuit cells placed on the original area 9 on the area 17 depending on the area increase rate. Moreover, the area 10 whose percentage voltage drop is the lowest is placed on an area not included in the area 17, with a distance of the circuit cells placed on the original area unreduced and unchanged. The above processing corresponds to step ST 7 shown in FIG. 2.

In this way, enlarging an area of each area and dispersing each circuit enables restraint of the voltage drop of the area whose percentage voltage drop is higher, as a result of centralized placement of the circuit cells on the original layout. Conversely, as for the area where the circuit cells are dispersedly placed on the original layout and has a lower percentage voltage drop, the voltage drop is promoted by reasons of narrowing of a space of the circuit cells, which alleviates the difference of the percentage voltage drop from areas whose percentage voltage drop is higher. This effectively and promptly takes a measure for the voltage drop of the layout of the semiconductor integrated circuit concerned.

The description will next be made as to FIG. 9B.

When the processing type setting part 5 in the layout device 1 of the third embodiment, upon extraction of a portion including an area whose percentage voltage drop exceeds the predetermined threshold to step ST 4 shown in FIG. 2, extracts a logical module (circuit component) composed of a group of circuit cells placed at a higher density than the predetermined threshold in the portion using the circuit connection information of the net list 2a in place of step ST 5 and step ST 6 shown in FIG. 2, and provides the information on identification of these modules to the layout generating part 6. In FIG. 9B, assuming that logical modules 18,19 composed of a group of circuit cells placed at a higher density than the predetermined threshold in the area 8 are placed on the area 8 adjacent to one another.

Subsequently, the layout generating part 6 changes a placement position of the logical modules in accordance with the percentage voltage drop of each area. In FIG. 9B, at the area 8 whose percentage voltage drop is higher two logical modules 18,19 are placed adjacent to each other, so that the logical module 19 is moved to the area 9 whose percentage voltage drop is medium in order to take it as a logical module 20. The above processing corresponds to step ST 7 shown in FIG. 2.

In this way, moving the logical module 9 to the area 9 whose percentage voltage drop is lower and taking the module 9 as the logical module 20 allows restraint of the voltage drop of the area whose percentage voltage drop is higher as a result the adjacent logical modules 18, 19 composed of a number of circuit cells to be supplied thereto the power voltage on the original layout. Conversely, as for the area 9 whose percentage voltage drop is lower on the original layout, the voltage drop is promoted due to placement of the logical module 20, which alleviates a difference of the percentage voltage drop from the area 8 whose percentage voltage drop is higher. This effectively and promptly takes a measure for the voltage drop of the semiconductor integrated circuit concerned.

Fourth Embodiment

In the above third embodiment, an example is given that the processing to adjust the voltage drop due to the densely placed circuit cells by avoiding adjacently placing the logical module composed of the densely placed circuit cells. In contrast, the fourth embodiment is directed to classifying every prescribed number of groups circuit cells in the order of the circuit cells included in an area whose percentage voltage drop is higher on the layout to be processed, and adjusts the voltage drop due to the densely placed circuit cells by avoiding adjacently placing the circuit cells classified into the same group in performing a re-layout. Besides, the layout device of the fourth embodiment has the basic configuration common to the first embodiment, but differ in contents of the re-layout processing information 4, and operations of the processing type setting part 5 and the layout generating part 6 as mentioned later.

Figure 10A:
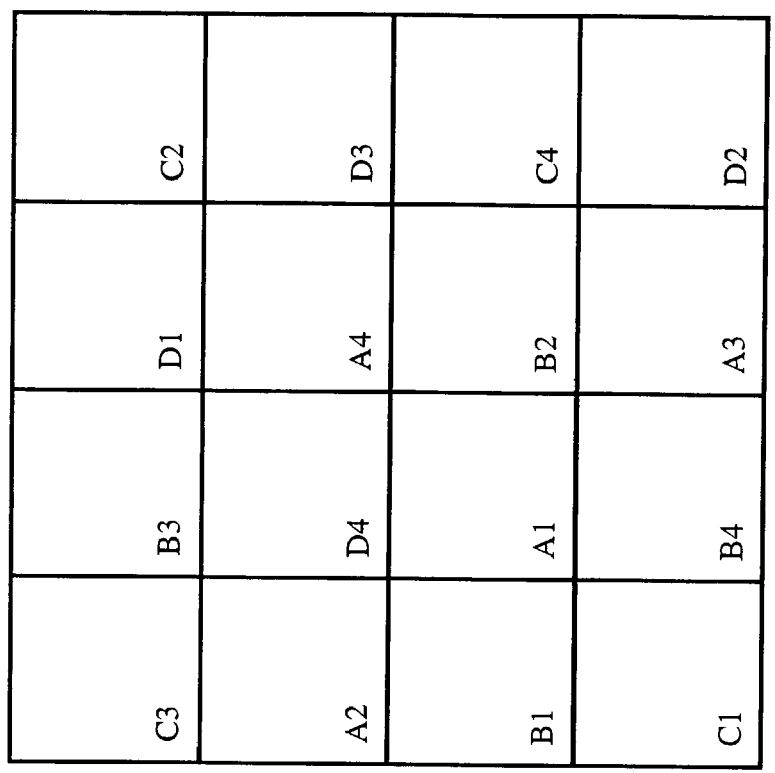
FIG. 10 is a drawing explaining layout change processing to restrain the voltage drop by the layout device of a fourth embodiment.

FIG. 10 is a drawing explaining layout change processing to restrain the voltage drop by the layout device of the fourth embodiment. FIG. 10A is a drawing showing the results obtained by classifying every prescribed number of groups circuit cells in the order of the circuit cells included in an area whose percentage voltage drop is higher on the layout.

Figure 10B:
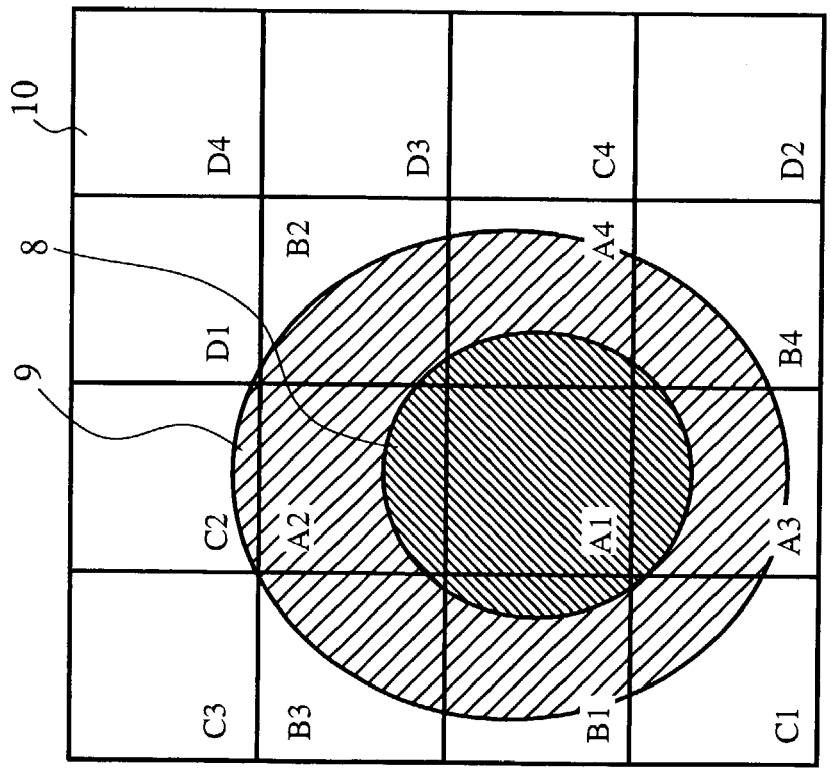

FIG. 10B is a drawing showing the results obtained by applying re-layout processing to the layout shown in FIG. 10A. The same reference numerals as FIG. 3 indicate the same components, and therefore descriptions thereof are omitted for brevity's sake.

Initially, the processing type setting part 5 in the layout device of the fourth embodiment, upon extraction of a portion including an area whose percentage voltage drop exceeds the predetermined threshold to step ST 4 shown in FIG. 2 described in the first embodiment, reads out information on grouping of the circuit cells on the layout, which is held in advance as information for the re-layout processing information 4 in place of step ST 5 and step ST 6 shown in FIG. 2, and provides the information to the layout generating part 6.

Subsequently, the layout generating part 6 classifies every prescribed number of groups circuit cells in the order of the circuit cells included in an area whose percentage voltage drop is higher depending on conditions for grouping of the circuit cells defined by the re-layout processing information 4. In FIG. 10A, the prescribed number is defined as 4 as a condition of grouping of the circuit cells. Circuit cells included in the area 8 whose percentage voltage drop is the highest are classified into a group A (A1–A4), circuit cells included in the area 9 whose percentage voltage drop is medium are classified into a group B (B1–B4), and circuit cells included in the area 10 whose percentage voltage drop are the lowest are classified into a group C (C1–C4) and a group D (D1–D4).

Then, the layout generating part 6 performs re-layout processing on the condition that the circuit cells not included in the same group do not adjacent to one another. For example, in the original layout shown in FIG. 10A, the circuit cell A1 included in the group A are adjacent to the circuit cells A2–A4 included in the same group and the circuit cell B1. The circuit cells B1,B4,D4 are re-laid out so that they are adjacent to the circuit cell A1 included in the group A as shown in FIG. 10B.

Namely, moving and dispersing the circuit cells restrains the voltage down of an area whose percentage voltage drop is higher, as a result of centralized placement of the circuit cells to be supplied thereto the power supply voltage on the original layout. Conversely, as for an area where the circuit cells are dispersedly placed on the original layout and whose percentage voltage drop is lower, the voltage drop is promoted, which alleviates a difference of the percentage voltage drop from areas whose percentage voltage drop is higher. The above processing corresponds to step ST 7 shown in FIG. 2.

In this way, a re-layout to alleviate the difference of the percentage voltage drop is applied to the area whose percentage voltage drop exceeds the predetermined threshold, thereby effectively and promptly taking a measure for the voltage drop of the layout of the semiconductor integrated circuit concerned.

The another embodiment of the re-layout processing will next be described below.

Figures 11A, 11B:
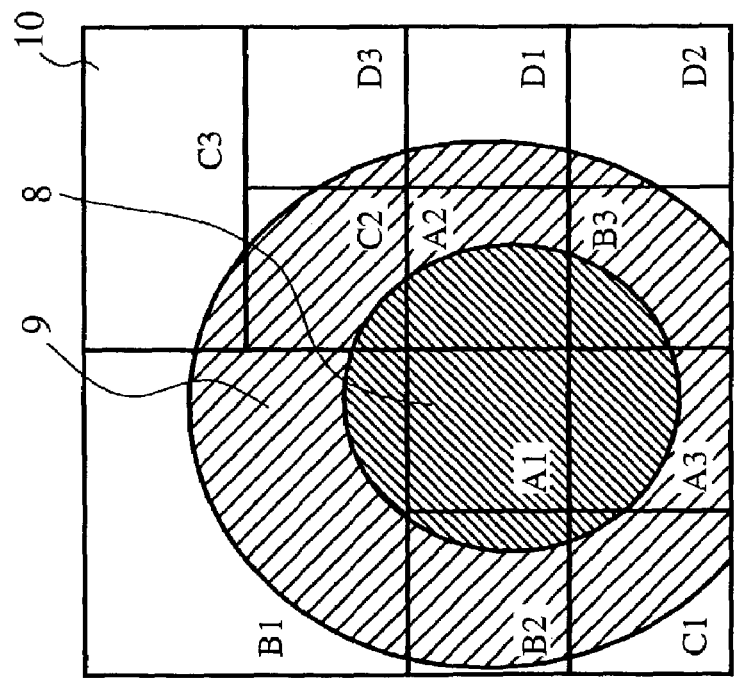
FIG. 11 is a drawing explaining another example of layout change processing to restrain the voltage drop by the layout device of a fourth embodiment.

FIG. 11 is a drawing explaining an another example of the layout change processing to restrain the voltage drop by the layout device of the fourth embodiment. FIG. 1A is a drawing showing the results obtained by classifying every prescribed number of groups circuit cells in the order of a certain cell whose percentage voltage drop is higher on the layout. FIG. 11B is a drawing showing the results obtained by applying the re-layout processing to the layout using the dummy cells shown in FIG. 11A. The same reference numerals as FIG. 3 indicate the same components, and therefore descriptions thereof are omitted for brevity's sake.

Initially, the processing type setting part 5 in the layout device 1, upon extraction of a portion including an area whose percentage voltage drop exceeds the predetermined threshold to step ST 4 shown in FIG. 2 described in the first embodiment, reads out information on grouping of the circuit cells on the layout and on connection relationship among the circuit cells to be added thereto the dummy cells, which are held in advance as the re-layout processing information 4, and provides the information to the layout generating part 6.

Subsequently, the layout generating part 6 classifies every prescribed number of groups circuit cells in the order of the circuit cells included in an area whose percentage voltage drop is higher depending on the grouping condition of the circuit cells defined in the re-layout processing information 4. In FIG. 11A, the above prescribed number is defined as 4 as a condition of grouping of the circuit cells. Circuit cells included in the area 8 whose percentage voltage drop is higher are classified into the group A (A1–A3), circuit cells included in the area 9 whose percentage voltage drop is medium are classified into the group B (B1–B3), and circuit cells include in the area 10 whose percentage voltage drop is lowest are classified into the group C (C1–C3) and the group D (D1–D3).

Then, the layout generating part 6 adds the dummy cells on the basis of circuit connection information of the net list 2a and information on the connection relationship between the circuit cells to be added thereto the dummy cells defined in the re-layout processing information 4, and performs re-layout processing so that the circuit cells included in the same group are not adjacent to one another. For example, in the original layout shown in FIG. 11A, the circuit cell A1 included in the group A are adjacent to the circuit cells A2,A3 and the circuit cells B1,B2 in the same circuit group. Here, supposing that the circuit cells A1,A3 and the circuit cells B1,B2 correspond to the connection relationship between the circuit cells to be added thereto the dummy cells defined in the re-layout processing information 4.

After that, when the layout generating part 6 applies re-layout processing to the layout shown in FIG. 11A, a dummy cell C5 (–) is placed between the circuit cell A1 and the circuit cell A3. A dummy cell C4 (–) is placed between the circuit cell B1 and the circuit cell B2. An underlined cell A4 (–), a cell A5 (–), a cell B4 (–), a cell C4 (–) to a cell C7 (–), a cell D4 (–), and a cell D5 (–) represent dummy cells that have the lowest priority of placement of the circuit cells in performing a re-layout. For an electrical filing purpose, the underlined is indicated by bar (–).

There are no connection relationship defined in the re-layout processing information 4 to be added thereto the dummy cells between the circuit cells other than the above in the neighborhood of the circuit cell A1. Such the being case, a condition is adopted that the circuit cells included in the same group are not adjacent to each other among these circuit cells. As a result, the circuit cell A1 included in the group A is re-laid out so that the circuit cell B1 and the dummy cell B4 (–), the dummy cell C4 (–), and the dummy cell C5 (–) are adjacent to the circuit cell A1. The above processing corresponds to step ST 7 shown in FIG. 2.

In passing, as a connection relationship between the circuit cells to be added thereto the dummy cells, there can be one in which the dummy cells may not be placed to a distant position where they are connected through a plurality of cells owing to a limitation imposed on a signal propagation speed between circuits.

In this way, moving and dispersing the circuit cells while taking into account the circuit cells having the connection relationship that the circuit cells cannot placed to a distant position where they are connected through a plurality of circuit cells, the voltage drop of the area whose percentage voltage drop is higher is restrained, as a result of centralized placement of the circuit cells to be supplied thereto the power voltage on the original layout. Conversely, as for the area where the circuit cells are dispersedly placed on the original layout and whose percentage voltage drop is lower, the voltage drop is promoted, which alleviates a difference of the percentage voltage drop from areas whose percentage voltage drop is higher.

While, in the above preferred embodiments of the invention, the layout device and program are given as an example, it should be understood by those skilled in the art that various modifications and changes may be made without departing from the sprit and scope of the invention.

Also, it should be noted that the invention meets all the objects mentioned above and also has the advantages of wide commercial utility, and that the invention has been set forth for purposes of illustration only and not of limitation. That is, the invention is limited only by the following claims which follow. Consequently, reference should be made to the following claims in determining the full scope of the invention.

What is claimed is:

1. A layout device comprising:
   a processing type setting part for classifying every area of a layout of a semiconductor integrated circuit in accordance with percentage voltage drop in the circuit, and for extracting a processing target portion composed of a group of areas, including an area having a percentage voltage drop exceeding a predetermined threshold;
   a layout generating part for applying layout processing to alleviate differences of the percentage voltage drops, among the areas, for circuit components included in the processing target portion; and
   a memory for storing, in accordance with the percentage voltage drop, an occupancy rate of dummy cells that act as a placement forbidden area of the circuit cells, wherein the layout generating part places, as layout change processing, the circuit cells after the dummy cells have placed at the occupancy rate read out from the memory in accordance with the percentage voltage drop of each area in the processing target portion.

2. A layout device comprising:
   a processing type setting part for classifying every area of a layout of a semiconductor integrated circuit in accordance with percentage voltage drop in the circuit, and for extracting a processing target portion composed of a group of areas, including an area having a percentage voltage drop exceeding a predetermined threshold;
   a layout generating part for applying layout processing to alleviate differences of the percentage voltage drops, among the areas, for circuit components included in the processing target portion; and
   a memory for storing, in accordance with the percentage voltage drop, an area change rate of dummy cells that act as a placement forbidden area of circuit cells and number of the dummy cells to be placed in proximity to the circuit cells, wherein the layout generating part reads in, as layout change processing, number of dummy cell placements and the area change rate from the memory, in accordance with the percentage voltage drop of each area in the processing target portion, and places the circuit cells, to which the dummy cells having areas changed at the area change rate, are adjacent to the number of dummy cell placements.

3. A layout device comprising:
   a processing type setting part for classifying every area of a layout of a semiconductor integrated circuit in accordance with percentage voltage drop in the circuit, and for extracting a processing target portion composed of a group of areas, including an area having a percentage voltage drop exceeding a predetermined threshold;
   a layout generating part for applying layout processing to alleviate differences of the percentage voltage drops, among the areas, for circuit components included in the processing target portion; and
   a memory for storing, in accordance with the percentage voltage drop, an area change rate of a placement area of the circuit cells, wherein the layout generating part places, as layout change processing, the circuit cells, after an area of the placement area has changed, at the area change rate read out from the memory, in accordance with the percentage voltage drop of each area in the processing target portion.

* * * * *